(12) United States Patent
Chen et al.

(10) Patent No.: US 12,071,683 B2
(45) Date of Patent: Aug. 27, 2024

(54) CLAMPING DEVICE

(71) Applicant: Kunshan Go-Visionox Opto-Electronics Co., Ltd., Kunshan (CN)

(72) Inventors: Haitao Chen, Kunshan (CN); Qiangqiang Li, Kunshan (CN); Bin Xue, Kunshan (CN); Xiaogang Xin, Kunshan (CN); Fei Sun, Kunshan (CN); Zaifeng Qiu, Kunshan (CN)

(73) Assignee: KUNSHAN GO-VISIONOX OPTO-ELECTRONICS CO., LTD., Kushan Jiangsu (CN)

( * ) Notice: Subject to any disclaimer, the term of this patent is extended or adjusted under 35 U.S.C. 154(b) by 381 days.

(21) Appl. No.: 17/537,716

(22) Filed: Nov. 30, 2021

(65) Prior Publication Data

US 2022/0090257 A1    Mar. 24, 2022

Related U.S. Application Data

(63) Continuation of application No. PCT/CN2020/118996, filed on Sep. 29, 2020.

(30) Foreign Application Priority Data

Dec. 26, 2019    (CN) .......................... 201922386790.2

(51) Int. Cl.
*H01L 21/683* (2006.01)
*C23C 14/50* (2006.01)

(52) U.S. Cl.
CPC ............ *C23C 14/50* (2013.01); *H01L 21/683* (2013.01); *Y10T 29/5397* (2015.01)

(58) Field of Classification Search
CPC ....... C23C 14/50; H01L 21/68; H01L 21/682; Y10T 29/53678; Y10T 29/53826; Y10T 29/5397; Y10T 29/53674
See application file for complete search history.

(56) References Cited

U.S. PATENT DOCUMENTS

| | | | | |
|---|---|---|---|---|
| 681,564 A | * | 8/1901 | Morrison et al. ...... | B21D 43/05 100/207 |
| 5,106,441 A | * | 4/1992 | Brosig .................. | G02F 1/1341 349/190 |
| 2012/0229999 A1 | * | 9/2012 | Hussain ............. | G01R 31/2886 361/783 |

(Continued)

FOREIGN PATENT DOCUMENTS

| CN | 103451597 A | 12/2013 |
|---|---|---|
| CN | 106987799 A | 7/2017 |

(Continued)

OTHER PUBLICATIONS

International Search Report and Written Opinion (International Application No. PCT/CN2020/118996) with English Translation, dated Dec. 31, 2020, 8 pages.

*Primary Examiner* — Tyrone V Hall, Jr.
(74) *Attorney, Agent, or Firm* — Quarles & Brady LLP

(57) ABSTRACT

The present disclosure relates to a clamping device configured to clamp a substrate. The clamping device includes a clamping plate and a flattening mechanism. The flattening mechanism includes at least one adjusting member configured to operably act on the clamping plate to apply a force to the clamping plate to flatten the clamping plate.

19 Claims, 4 Drawing Sheets

(56) References Cited

U.S. PATENT DOCUMENTS

2013/0318774 A1   12/2013   Kang

FOREIGN PATENT DOCUMENTS

| CN | 107686960 A | 2/2018 |
| CN | 108417610 A | 8/2018 |
| CN | 208679660 U | 4/2019 |
| CN | 110512184 A | 11/2019 |
| CN | 211339668 U | 8/2020 |
| WO | 2017222009 A1 | 12/2017 |
| WO | 2019096426 A1 | 5/2019 |

* cited by examiner

CLAMPING DEVICE

CROSS-REFERENCE TO RELATED APPLICATIONS

This application is a continuation of International Patent Application No. PCT/CN2020/118996, filed on Sep. 29, 2020, entitled "CLAMPING DEVICE," which claims priority to Chinese Patent Application No. 201922386790.2, filed on Dec. 26, 2019, entitled "CLAMPING DEVICE." The content of both applications are hereby incorporated by reference in its entirety.

TECHNICAL FIELD

The present disclosure relates to the technical field of display panel manufacturing.

BACKGROUND

In the process of manufacturing a display panel, there is a need to vapor deposit a luminescent material onto the substrate through a vapor deposition process. In the vapor deposition process, the mask plate is first needed to be in alignment with the substrate, and a clamping device is used to clamp the substrate in an alignment system.

SUMMARY

An exemplary embodiment of the present disclosure provides a clamping device.

The clamping device is configured to clamp a substrate. The clamping device includes a clamping plate and a flattening mechanism.

The flattening mechanism includes at least one adjusting member disposed on the clamping plate and is configured to exert a force to the clamping plate to flatten the clamping plate.

In the clamping device provided by the exemplary embodiment of the present disclosure, since the adjusting member of the flattening mechanism operably acts on the clamping plate and applies a force to the clamping plate to flatten the clamping plate, the deformation of the clamping plate is reduced and the flatness of the clamping plate is ensured, so that the substrate can be everywhere closely attached to the clamping plate, ensuring the uniformity of the vapor deposition.

DETAILED DESCRIPTION

In order to facilitate the understanding of the present disclosure, the present disclosure will be described more completely hereinafter with reference to the related accompanying drawings. Exemplary embodiments of the present disclosure are shown in the accompanying drawings. However, the present disclosure may be embodied in many different forms and is not limited to the embodiments described herein. Rather, these embodiments are provided so that the understanding of the disclosure of the present disclosure will be more thorough and complete.

The clamping device includes a clamping plate and a plurality of clamping claws. The upper surface of the substrate is attached to the lower surface of the clamping plate in a thickness direction, and the plurality of clamping claws abut peripheral regions of the lower surface of the substrate, such that the substrate is fixed between the clamping plate and the clamping claws. After that, the mask plate and the substrate are aligned with each other, and then the vapor deposition can be performed on the substrate.

Figure 1:
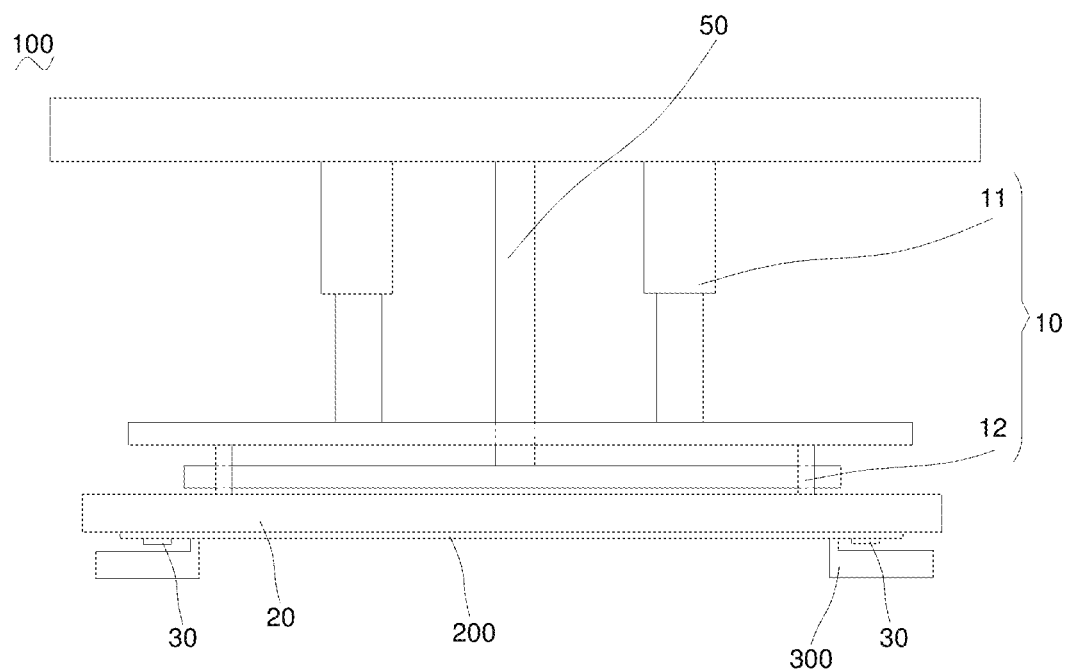
FIG. 1 is a schematic structural view of a clamping device.

FIG. 1 shows a schematic structural view of a clamping device.

As shown in FIG. 1, in the vapor deposition process, there is a need to first align a mask plate 300 with a substrate 200. In an alignment system, the substrate 200 is clamped by the clamping device 100, then the mask plate 300 is aligned with the substrate 200, and finally a luminescent material is vapor deposited on the substrate 200.

The clamping device 100 includes a clamping plate 20 and a plurality of clamping claws 30. An upper surface of the substrate 200 is attached to a lower surface of the clamping plate 20 in a thickness direction. The plurality of clamping claws 30 abuts peripheral regions of the lower surface of the substrate 200, such that the substrate 200 is fixed between the clamping plate 20 and the clamping claws 30. However, in performing the above-described method, the problem of uneven vapor deposition of the luminescent material on the substrate 200 often occurs.

When the substrate 200 is fixed between the clamping plate 20 and the clamping claws 30, the clamping plate 20 of the clamping device 100 may be deformed, which deteriorates the flatness of the clamping plate 20. Since the upper surface of the substrate 200 is attached to the lower surface of the clamping plate 20, the deformed clamping plate 20 may render the substrate 200 and the clamping plate 20 not closely attached to each other at a local position, which causes that the mask plate 300 and the substrate 200 are not closely attached to each other at the local position. As a result, the problem of uneven vapor deposition of the luminescent material occurs.

The clamping plate 20 of the clamping device 100 is hoisted at least by a suspension mechanism 10. As such, on the one hand, bearing forces of the various positions of the clamping plate 20 connected to the suspension mechanism 10 may be uneven, generating internal stress in the clamping plate 20 and thereby deforming the clamping plate 20. On the other hand, since the clamping plate 20 is suspended by the suspension mechanism 10, the clamping plate 20 is prone to dent and deform under its own weight.

In order to solve the above-described problem, an embodiment of the present disclosure provides a clamping device 100, which can improve the flatness of the clamping plate 20 when the clamping plate 20 is suspended, so that the substrate 200 and the clamping plate 20 are more closely attached to each other to ensure the uniformity of vapor deposition.

Figure 2:
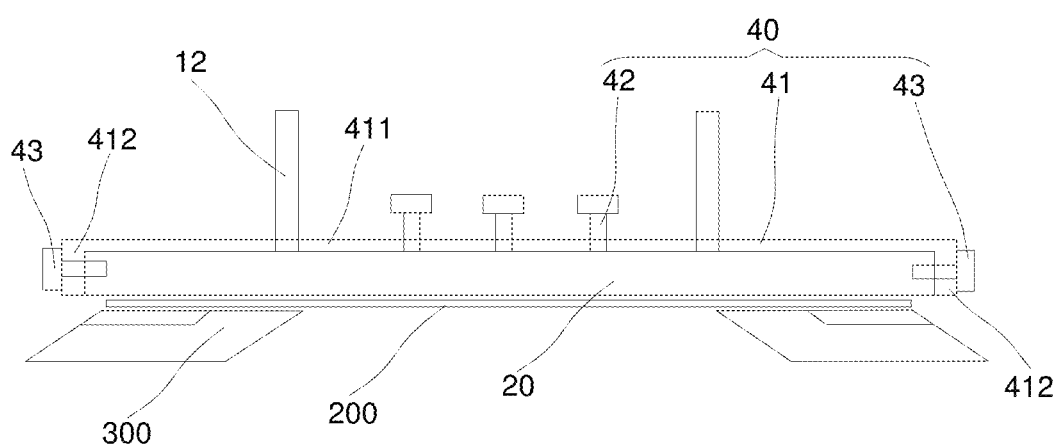
FIG. 2 is a cross-sectional view of a portion of the clamping device according to an embodiment of the present disclosure.
Figure 3:
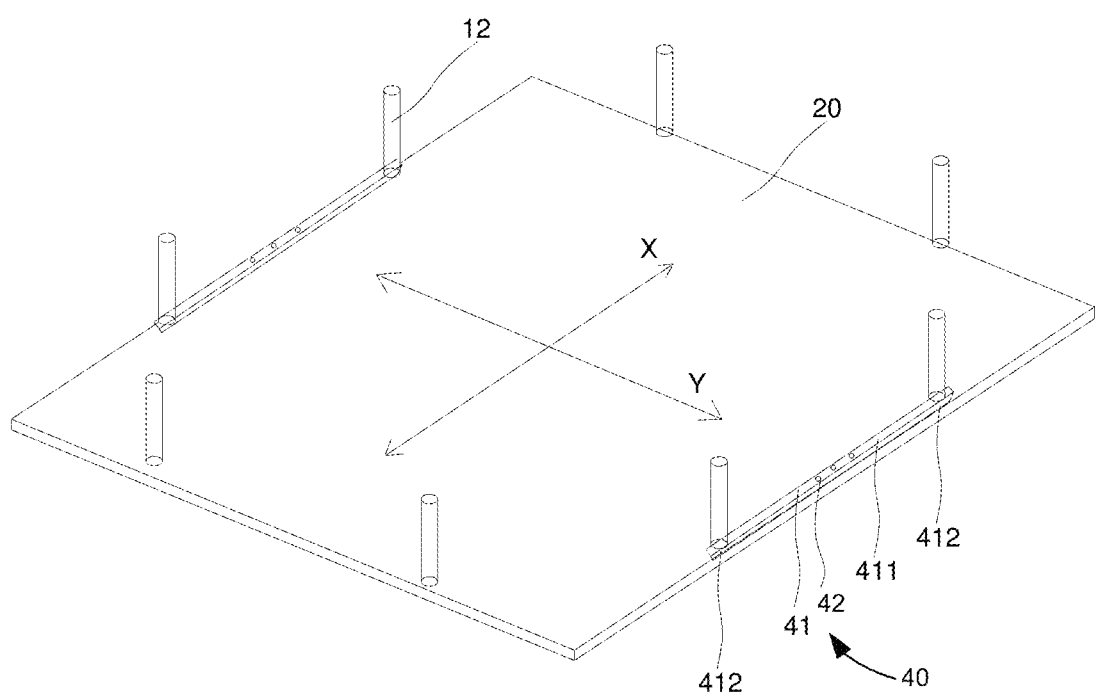
FIG. 3 is a perspective view of a portion of the clamping device according to another embodiment of the present disclosure.
Figure 4:
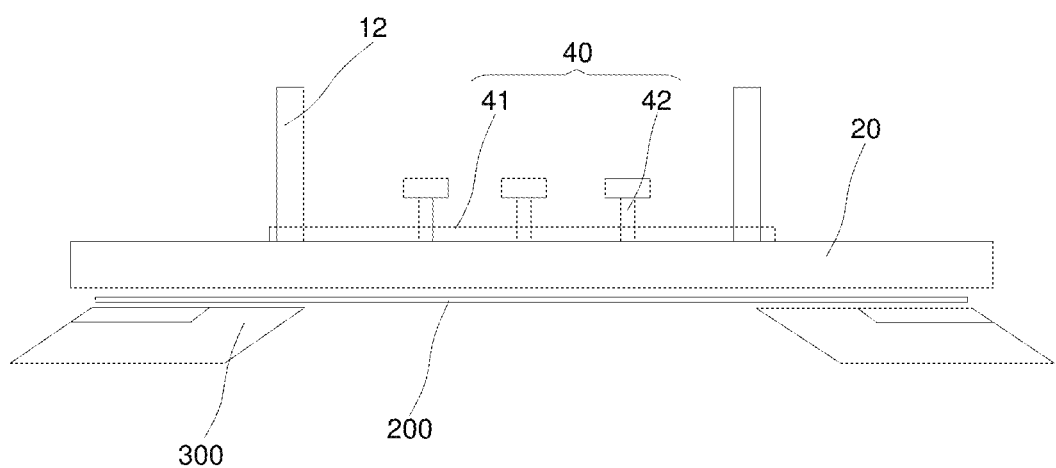
FIG. 4 is a cross-sectional view of the portion of the clamping device shown in FIG. 3.

FIG. 2 shows a cross-sectional view of a portion of the clamping device 100 according to an embodiment of the present disclosure. FIG. 3 shows a perspective view of a portion of the clamping device 100 according to another embodiment of the present disclosure. FIG. 4 shows a cross-sectional view of the portion of the clamping device 100 shown in FIG. 3.

Referring to FIG. 2 in conjunction with FIG. 1, the clamping device 100 in an embodiment of the present disclosure includes the clamping plate 20 and the clamping claws 30. The clamping claws 30 cooperate with the clamping plate 20 to clamp the substrate 200, so as to facilitate the subsequent vapor deposition of the luminescent material on the substrate 200.

Specifically, the clamping device 100 can include a plurality of clamping claws 30. When the substrate 200 is clamped, the upper surface of the substrate 200 abuts the lower surface of the clamping plate 20, and one end of each clamping claw 30 abut the lower surface of the substrate 200, thereby the substrate 200 is clamped between the clamping plate 20 and the clamping claws 30.

The clamping device 100 further includes a flattening mechanism including at least one adjusting member 40. The adjusting member 40 is configured to exert a force to the clamping plate 20 to flatten the clamping plate 20.

In the clamping device 100 provided by the embodiment of the present disclosure, since the adjusting member 40 operably applies a force to the clamping plate 20 to flatten the clamping plate 20, the deformation of the clamping plate 20 is reduced and the flatness of the clamping plate 20 is improved, so that the substrate 200 and the clamping plate 20 can be more closely attached to each other, thereby ensuring the uniformity of the vapor deposition.

In an embodiment, the clamping device 100 further includes the suspension mechanism 10, and the clamping plate 20 is suspended on one side of the suspension mechanism 10.

The suspension mechanism 10 includes a suspension frame 11 and a plurality of vertical suspension posts 12. Every two suspension posts 12 adjacent to each other are spaced apart from each other. The top end of each suspension post 12 is fixedly connected to the suspension frame 11, and the bottom end of each suspension post 12 is connected to the upper surface of the clamping plate 20. In an embodiment, the suspension post 12 is fixedly connected to the edge of the upper surface of the clamping plate 20.

In an embodiment, the adjusting member 40 is disposed on one side of the clamping plate 20 in a thickness direction of the clamping plate 20. Specifically, when the clamping plate 20 is deformed to form an upward convex portion during assemblage, the adjusting member 40 is provided on the upper side of the clamping plate 20, and the adjusting member 40 presses the upward convex portion downwards to flatten the clamping plate 20. When the clamping plate 20 is deformed during assemblage or under the action of its own weight to form a downward concave portion, the adjusting member 40 is provided on the lower side of the clamping plate 20, and the adjusting member 40 presses the downward concave portion upwards to flatten the clamping plate 20. It should be understood that when the adjusting member 40 is located on the lower side of the clamping plate 20, and that is, when the adjusting member 40 is located on one side of the clamping plate 20 away from the suspension post 12, the adjusting member 40 is located at the peripheral position of the clamping plate 20 to avoid affecting the arrangement of the substrate 200.

In some other embodiments, the adjusting member 40 can also be provided on the lower side of the clamping plate 20 when the clamping plate 20 is deformed to form the upward convex portion. The adjusting member 40 pulls the upward convex portion downwards to flatten the clamping plate 20. When the clamping plate 20 is deformed to form the downward concave portion, the adjusting member 40 can also be provided on the upper side of the clamping plate 20, and the adjusting member 40 pulls the downward concave portion upwards to flatten the clamping plate 20. In yet some other embodiments, the flattening mechanism includes a plurality of adjusting members 40 (i.e., at least two adjusting members 40). The plurality of adjusting members 40 can be respectively provided on the upper side and the lower side of the clamping plate 20. When the clamping plate 20 is deformed, the flatness of the clamping plate 20 is adjusted by the adjusting members 40 on at least one side. In some embodiments, the plurality of adjusting members 40 are disposed on the same side of the clamping plate 20, and the plurality of adjusting members 40 are axially symmetrically arranged about a central axis of a surface of the clamping plate 20 on which the plurality of adjusting members 40 are disposed.

For the convenience of description, the technical solution of the present disclosure will be described in detail below with an embodiment in which the clamping plate 20 has an upward convex deformation and the adjusting members 40 are disposed on the upper side of the clamping plate 20. This embodiment is merely used as an example for illustration and does not limit the technical scope of the present disclosure.

In this embodiment, the number of the adjusting members 40 is at least two to ensure uniformity of adjustment. The at least two adjusting members 40 are arranged symmetrically about the second central axis of the plane in which the clamping plate 20 is located to further ensure the uniformity of the adjustment. The second central axis is the central axis of the plane of the clamping plate 20 along a second direction (referring to FIG. 3, the second direction is the X-axis direction in FIG. 3). According to some embodiments, the at least two adjusting members 40 are disposed on both sides of the clamping plate 20 in a thickness direction of the clamping plate 20.

In the present embodiment, the clamping device 100 further includes a magnetic attraction mechanism 50 (as shown in FIG. 1). The magnetic attraction mechanism 50 is fixedly connected to the suspension frame 11, and the magnetic attraction mechanism 50 is attached to the surface of the clamping plate 20 facing away from the substrate 200 to further fix the substrate 200 by the magnetic attraction force. In this embodiment, in order to facilitate mounting the magnetic attraction mechanism 50, the adjusting members 40 are provided at the edges of the clamping plate 20 to reserve the position for the magnetic attraction mechanism 50.

In an embodiment, each adjusting member 40 includes a connecting portion 41 and at least one adjusting portion 42 connected to the connecting portion 41. The connecting portion 41 is fixedly connected to the suspension mechanism 10 and/or the clamping plate 20. The adjusting portion 42 is configured to exert a force to the clamping plate 20. Specifically, the adjusting portion 42 can pass through the connecting portion 41 and abut against the clamping plate 20, and the adjusting portion 42 is capable of moving in the penetration direction with respect to the connecting portion 41 to apply the force to the clamping plate 20. That is, the connecting portion 41 is engaged with the adjusting portion 42, and when the connecting portion 41 is stationary, the adjusting portion 42 moves in the penetration direction with respect to the connecting portion 41 to apply the force to the clamping plate 20.

Referring still to FIG. 2, specifically, since the deformation of the clamping plate 20 generally occurs in the central region of the clamping plate 20, the adjusting member 40 is provided in the peripheral region of the clamping plate 20, and the adjusting portion 42 of the adjusting member 40 is connected to the middle position of the peripheral region of the clamping plate 20 in order to ensure the flattening effect.

In an embodiment, the adjusting member 40 is integrally movable relative to the suspension mechanism 10, thereby generating the aforementioned force. For example, the adjusting member 40 can be assembled on the suspension post 12, and the adjusting member 40 is capable of sliding up and down with respect to the suspension post 12. When the adjusting member 40 slides relative to the suspension post 12, a force can be generated to flatten the clamping plate 20. When the adjusting member 40 is moved relative to the suspension post 12 to a position at which the clamping plate 20 is flattened, an additional fixing mechanism is set to fix the adjusting member 40 to the suspension post 12.

Referring still to FIG. 2, in a specific embodiment, the connecting portion 41 can be partially fixedly connected to the clamping plate 20. In some other embodiments, the connecting portion 41 can be partially fixedly connected to the suspension post 12 or can be partially fixedly connected to both the clamping plate 20 and the suspension post 12, which is not limited herein. Here, the partially fixedly connected connecting portion 41 refers to the connecting portion 41 which is not completely fixed in all positions with respect to the clamping plate 20 or the suspension post 12, and the connecting portion 41 has a local region movable with respect to the clamping plate 20 or the suspension post 12.

In an embodiment, the adjusting portion 42 is configured to abut against the clamping plate 20, and the position of the adjusting portion 42 relative to the connecting portion 41 is adjustable in the penetration direction. Since the connecting portion 41 is partially fixedly connected to the suspension post 12 and/or the clamping plate 20, the adjusting portion 42 applies a force to the clamping plate 20 to flatten the clamping plate 20 when the adjusting portion 42 is properly adjusted with respect to the connecting portion 41 in the penetration direction.

Specifically, each adjusting member 40 includes at least two adjusting portions 42 spaced apart from each other arranged in an extending direction of the connecting portion 41 (referring to FIG. 3, the extending direction is the X-axis direction in FIG. 3). The flattening effect of the adjusting member 40 is further ensured by cooperation of the at least two adjusting portions 42.

In another embodiment, each adjusting member 40 can include at least three adjusting portions 42. The at least three adjusting portions 42 form an adjusting plane to further ensure the flattening effect of the adjusting member 40.

More specifically, the adjusting portion 42 can be an adjusting screw to achieve a threaded connection between the adjusting portion 42 and the connecting portion 41. The adjusting portion 42 can be turned to adjust the flatness of the clamping plate 20.

Further, all the adjusting portions 42 included in each adjusting member 40 are symmetrically disposed about the first central axis of the plane in which the clamping plate 20 is located. The first central axis is the central axis of the plane of the clamping plate 20 along a first direction (referring to FIG. 3, the first direction is the Y-axis direction in FIG. 3), and the first direction intersects the second direction. In an embodiment, the first direction is substantially perpendicular to the second direction. When the number of the adjusting portions 42 included in the adjusting member 40 is an even number, every two corresponding adjusting portions 42 are symmetrically disposed about the first central axis. When the adjusting member 40 includes one adjusting portion 42, the adjusting portion 42 is symmetric about the first central axis. When the adjusting member 40 includes a plurality of adjusting portions 42, and the number of the plurality of adjusting portions 42 is an odd number, the adjusting portion 42 at the middle position is symmetric about the first central axis, and every two corresponding adjusting portions 42 equally distanced from the adjusting portion 42 at the middle position are symmetrically disposed about the first central axis.

It can be understood that the adjusting portion 42 can be moved with respect to the connecting portion 41 without adopting the threaded fit. For example, a mounting hole can be formed in the connecting portion 41. A plurality of grooves spaced apart from each other is sequentially formed in the inner wall of the mounting hole and arranged in an extending direction of the mounting hole. The adjusting portion 42 includes an adjusting spring and an adjusting plate. The adjusting spring abuts between the adjusting plate and the clamping plate 20. The adjusting plate is arranged in different grooves and compresses the adjusting spring to different degrees, thereby adjusting the flatness of the clamping plate 20.

In an embodiment, the adjusting portion 42 is connected to the connecting portion 41 through screw threads, and the adjusting portion 42 is fixed to the clamping plate 20 in the axial direction (i.e., the thickness direction of the clamping plate 20) and circumferentially rotatably connected to the clamping plate 20 or the connecting portion 41. The connecting portion 41 is partially fixedly connected to the suspension post 12 and/or the clamping plate 20. The clamping plate 20 does not restrict the rotation of the adjusting portion 42 when the adjusting portion 42 is rotated with respect to the connecting portion 41 along the screw threads, so that the adjusting portion 42 can generate a downward pressing force to the clamping plate 20.

Specifically, the adjusting portion 42 is axially fixed to and circumferentially rotatable with respect to the clamping plate 20 via a bearing. The outer ring of the bearing is fixedly connected to the clamping plate 20, and the inner ring of the bearing is fixedly connected to the adjusting portion 42. It can be understood that in other embodiments, the adjusting portion 42 can be axially fixed to and circumferentially rotatable with respect to the clamping plate 20 in other ways, which are not enumerated herein.

In an embodiment, the adjusting portion 42 is connected to the clamping plate 20 through screw threads, and the adjusting portion 42 is axially fixed to the connecting portion 41 and circumferentially rotatably connected to the connecting portion 41. The connecting portion 41 is partially fixedly connected to the suspension post 12 and/or the clamping plate 20. The clamping plate 20 does not restrict the rotation of the adjusting portion 42 when the adjusting portion 42 is rotated with respect to the connecting portion 41 along the screw threads, so that the adjusting portion 42 can generate the downward pressing force to the clamping plate 20.

Referring still to FIG. 2, the connecting portion 41 can be partially fixedly connected to the clamping plate 20, and disposed across the entire clamping plate 20 in the first direction and/or the second direction. In this way, it is ensured that the entire clamping plate 20 can be flattened at the same time when the adjusting portion 42 applies a force to the clamping plate 20 to flatten the clamping plate 20. It can be understood that, when the connecting portion 41 is disposed across the entire clamping plate 20 in the first direction and/or the second direction, the adjusting member 40 is disposed on the side of the clamping plate 20 away from the substrate 200 in order to avoid affecting the arrangement of the substrate 200. It can be understood that, in other embodiments, the connecting portion 41 can also be disposed across only a portion of the clamping plate 20.

Referring still to FIG. 2, in an embodiment, only both ends of the connecting portion 41 are fixedly connected to the clamping plate 20 and/or the suspension post 12. Specifically, the connecting portion 41 includes a connecting section 411 and two fixing sections 412 respectively connected to both ends of the connecting section 411. The two fixing sections 412 are fixedly connected to both ends of the clamping plate 20 in the horizontal direction. The adjusting portion 42 is disposed on the connecting section 411 and penetrates the connecting section 411. More specifically, the two fixing sections 412 extend in the thickness direction of the clamping plate 20 and are respectively attached to the two opposite side surfaces of the clamping plate 20. The fixing sections 412 are fixedly connected to the clamping plate 20 via a plurality of fixing screws 43.

Referring to FIG. 3 and FIG. 4, in another embodiment, the connecting portion 41 is partially fixedly connected to the suspension posts 12. The connecting portion 41 is disposed across a portion of the clamping plate 20 in the first direction and/or the second direction, thereby saving material. Specifically, the connecting portion 41 includes a connecting section 411 and two fixing sections 412 connected to both ends of the connecting section 411, respectively. Only the two fixing sections 412 of the connecting portion 41 are fixedly connected to the two suspension posts 12, respectively. The adjusting portion 42 is disposed on the connecting section 411 and penetrates the connecting section 411.

In the above-described clamping device 100, the adjusting member 40 applies a force to the clamping plate 20 to flatten the clamping plate 20, thereby reducing the deformation of the clamping plate 20 and ensuring the flatness of the clamping plate 20, so that the substrate 200 can be closely attached to the clamping plate 20, ensuring the uniformity of the vapor deposition of the luminescent material on the substrate 200.

The technical features of the embodiments described above can be arbitrarily combined. For the sake of brevity of description, not all possible combinations of the technical features in the aforementioned embodiments are described. However, as long as there is no contradiction between the combinations of these technical features, all should be considered as the scope of this specification.

The aforementioned embodiments only express several implementations of the present disclosure, and the descriptions thereof are more specific and detailed, but they cannot be understood as a limitation on the scope of the present disclosure. It should be noted that, for those who skilled in the art, a plurality of modifications and improvements can be made without departing from the concept of the present disclosure, which all belong to the protection scope of the present disclosure. Therefore, the protection scope of the present disclosure shall be subject to the appended claims.

What is claimed is:

1. A clamping device, configured to clamp a substrate, comprising:
   a clamping plate; and
   a flattening mechanism comprising at least one adjusting member, the at least one adjusting member being disposed on the clamping plate and being configured to exert a force to the clamping plate to flatten the clamping plate;
   wherein the adjusting member comprises:
   a connecting portion connected to the clamping plate; and
   at least one adjusting portion connected to the connecting portion, the at least one adjusting portion passing through the connecting portion and configured to exert the force to the clamping plate.

2. The clamping device according to claim 1, wherein the flattening mechanism is disposed on at least one side of the clamping plate in a thickness direction of the clamping plate.

3. The clamping device according to claim 2, wherein the flattening mechanism is disposed on a peripheral position of at least one side of the clamping plate in the thickness direction of the clamping plate.

4. The clamping device according to claim 1, wherein the flattening mechanism is axially symmetric about a central axis of a surface of the clamping plate on which the flattening mechanism is disposed.

5. The clamping device according to claim 1, wherein the flattening mechanism comprises at least two adjusting members, the at least two adjusting members are disposed on both sides of the clamping plate in a thickness direction of the clamping plate.

6. The clamping device according to claim 1, wherein the flattening mechanism comprises at least two adjusting members, the at least two adjusting members are disposed on the same side of the clamping plate, and the at least two adjusting members are axially symmetrically arranged about a central axis of a surface of the clamping plate on which the at least two adjusting members are disposed.

7. The clamping device according to claim 1, wherein the adjusting portion is configured to abut against one side of the clamping plate in a thickness direction of the clamping plate.

8. The clamping device according to claim 1, wherein the at least one adjusting portion comprises at least two adjusting portions, and the at least two adjusting portions are spaced apart from each other and arranged in an extending direction of the connecting portion.

9. The clamping device according to claim 1, wherein the adjusting portion is axially symmetric about a central axis of a surface of the clamping plate on which the adjusting portion is disposed, and the central axis is perpendicular to an extending direction of the connecting portion.

10. The clamping device according to claim 1, wherein the adjusting portion is connected to the connecting portion through screw threads, and the adjusting portion is axially fixed to the clamping plate and is circumferentially rotatably connected to the clamping plate or the connecting portion.

11. The clamping device according to claim 1, wherein:
    the connecting portion of the adjusting member is provided with a mounting hole, an inner wall of the mounting hole is provided with a plurality of grooves spaced apart from each other and arranged in an extending direction of the mounting hole;
    the adjusting portion of the adjusting member comprises an adjusting spring and an adjusting plate, the adjusting spring abuts between the adjusting plate and the clamping plate.

12. The clamping device according to claim 1, wherein the clamping device further comprises a suspension mechanism, and the connecting portion is partially fixedly connected to the suspension mechanism.

13. The clamping device according to claim 12, wherein both ends of the connecting portion are fixedly connected to the suspension mechanism.

14. The clamping device according to claim 13, wherein the connecting portion comprises a connecting section and two fixing sections respectively connected to both ends of the connecting section;
   wherein the suspension mechanism comprises two suspension posts, the two fixing sections are fixedly connected to the two suspension posts, respectively.

15. The clamping device according to claim 1, wherein the connecting portion is disposed across entire of the clamping plate in a first direction and/or a second direction.

16. The clamping device according to claim 15, wherein the connecting portion comprises a connecting section and two fixing sections respectively connected to both ends of the connecting section, and the two fixing sections are fixedly connected to the clamping plate, respectively.

17. The clamping device according to claim 16, wherein the two fixing sections extend in a thickness direction of the clamping plate, and are respectively attached to two opposite side surfaces of the clamping plate.

18. The clamping device according to claim 17, wherein the two fixing sections are fixedly connected to the clamping plate via a plurality of fixing screws.

19. The clamping device according to claim 1, further comprising a magnetic attraction mechanism;
   wherein the magnetic attraction mechanism is attached to a surface of the clamping plate facing away from the substrate to further fix the substrate by a magnetic attraction force.

\* \* \* \* \*